(12) United States Patent
Cavanaugh Pingree et al.

(10) Patent No.: US 9,297,068 B2
(45) Date of Patent: Mar. 29, 2016

(54) WEAR PARTS HAVING COATING RUN-OUT AND METHODS OF PRODUCING SAME

(75) Inventors: Liam S. Cavanaugh Pingree, Seattle, WA (US); Michael Howard-Edward Ware, Renton, WA (US)

(73) Assignee: The Boeing Company, Chicago, IL (US)

( * ) Notice: Subject to any disclaimer, the term of this patent is extended or adjusted under 35 U.S.C. 154(b) by 432 days.

(21) Appl. No.: 13/414,022

(22) Filed: Mar. 7, 2012

(65) Prior Publication Data

US 2013/0236704 A1    Sep. 12, 2013

(51) Int. Cl.
*C23C 16/00* (2006.01)
*C23C 16/04* (2006.01)
*C23C 16/26* (2006.01)

(52) U.S. Cl.
CPC .............. *C23C 16/042* (2013.01); *C23C 16/26* (2013.01); *Y10T 428/24802* (2015.01)

(58) Field of Classification Search
None
See application file for complete search history.

(56) References Cited

U.S. PATENT DOCUMENTS

| | | | |
|---|---|---|---|
| 4,159,222 A * | 6/1979 | Lebow et al. | 216/20 |
| 4,447,904 A * | 5/1984 | Burnham | 372/45.01 |
| 4,922,321 A * | 5/1990 | Arai et al. | 257/752 |
| 6,277,198 B1 * | 8/2001 | Yao et al. | 118/503 |
| 7,300,684 B2 | 11/2007 | Boardman et al. | |
| 7,444,955 B2 | 11/2008 | Boardman et al. | |
| 7,541,069 B2 | 6/2009 | Tudhope et al. | |
| 7,608,151 B2 | 10/2009 | Tudhope et al. | |
| 7,626,135 B2 | 12/2009 | Boardman et al. | |
| 7,629,031 B2 | 12/2009 | Dornfest et al. | |
| 7,838,085 B2 | 11/2010 | Boardman et al. | |
| 7,838,793 B2 | 11/2010 | Tudhope et al. | |
| 2002/0086513 A1 * | 7/2002 | Farnworth | 438/613 |
| 2003/0026903 A1 * | 2/2003 | Sun | 427/256 |
| 2004/0147132 A1 * | 7/2004 | Nam et al. | 438/720 |
| 2005/0214478 A1 * | 9/2005 | Hanawa et al. | 427/569 |
| 2006/0019030 A1 * | 1/2006 | Lipson et al. | 427/248.1 |
| 2008/0139075 A1 * | 6/2008 | Birrell et al. | 445/61 |
| 2010/0221425 A1 * | 9/2010 | Liu et al. | 427/249.7 |
| 2012/0009798 A1 * | 1/2012 | Maynard et al. | 438/758 |

OTHER PUBLICATIONS

Webpage-www.sub-one.com/breakthrough.html, downloaded on Feb. 17, 2012.
Webpage-en.wikipedia.org/wiki/Metalorganic_chemical_vapour_deposition, downloaded on Feb. 17, 2012.
Webpage-en.wikipedia.org/wiki/Chemical_vapor_deposition, downloaded on Feb. 17, 2012.
Webpage-en.wikipedia.org/wiki/Plasma_electrolytic_oxidation, downloaded on Feb. 17, 2012.
Webpage-en.wikipedia.org/wiki/Diamond-like_carbon, downloaded on Feb. 17, 2012.
Webpage-en.wikipedia.org/wiki/Plasma-enhanced_chemical_vapor_deposition, downloaded on Feb. 17, 2012.

* cited by examiner

*Primary Examiner* — Mandy Louie
(74) *Attorney, Agent, or Firm* — DASCENZO Intellectual Property Law, P.C.

(57) ABSTRACT

Wear parts having run-out and methods of producing the same, systems and control structures used to produce wear parts having run-out, and associated methods and software are disclosed. Some methods utilize a plasma-enhanced chemical vapor deposition process to produce a coating with a desired coating profile on a wear part.

19 Claims, 3 Drawing Sheets

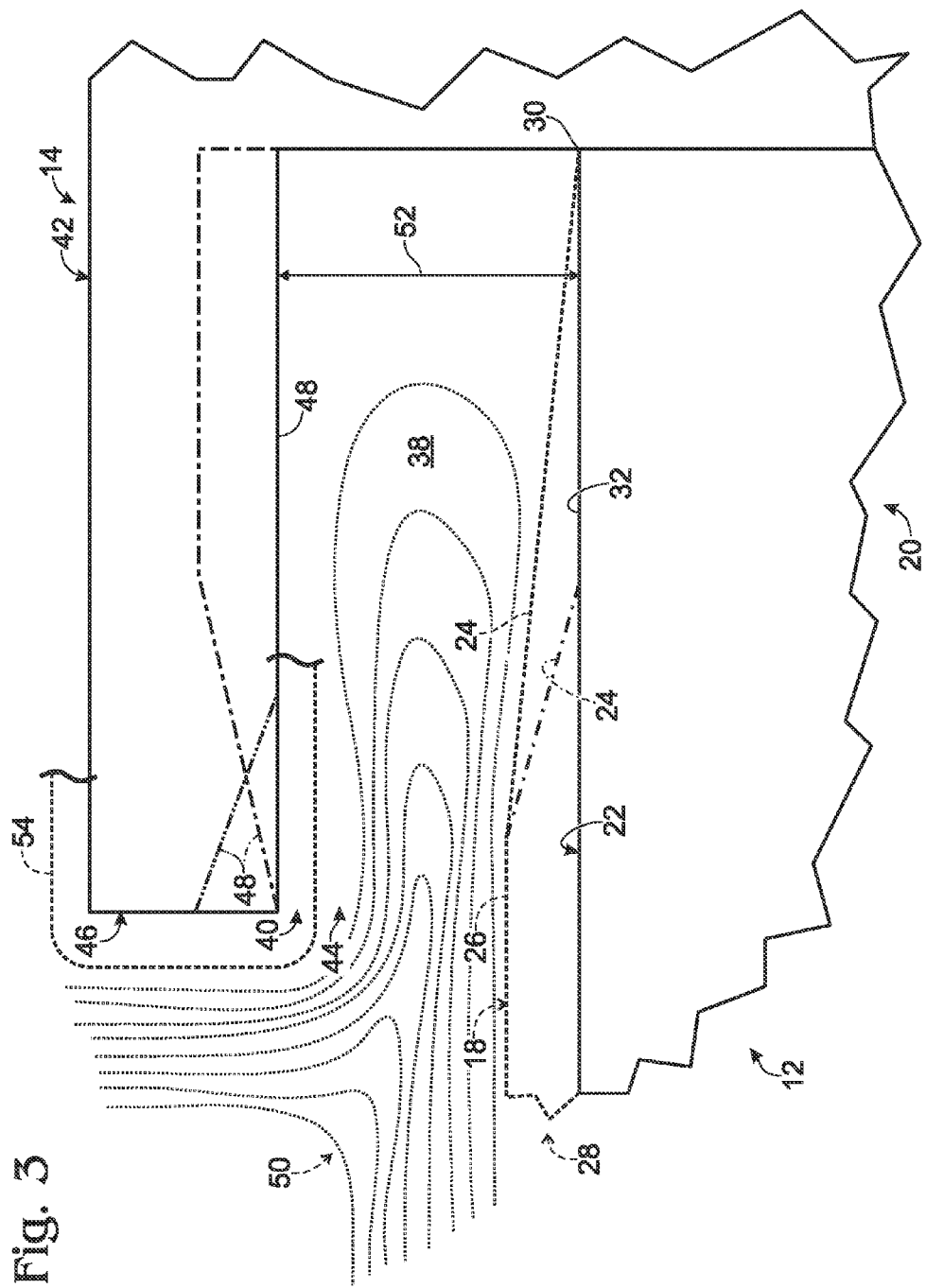

WEAR PARTS HAVING COATING RUN-OUT AND METHODS OF PRODUCING SAME

FIELD

The present application relates to wear parts.

BACKGROUND

The term "wear parts" refers to parts, such as of mechanical assemblies, that experience repetitive movements, repeated relative engagement with other parts, and/or otherwise generally undergo processes that require the wear parts to be replaced after a period of time. Examples of wear parts may include such illustrative, non-exclusive examples as fasteners, bushings, bearing carriers, sleeves, and pins. In the aerospace industry, for example, wear parts may include parts associated with landing gear systems, flap and actuator systems, or any other systems that include parts that typically require replacement over time. Aircraft, automobiles, spacecraft, trains, machine tools, robots, manufacturing machines, drilling equipment, pumping equipment, energy generation equipment, vibration absorption equipment, and many, many other mechanical systems also utilize wear parts that require replacement.

Wear parts, or at least wear surfaces of wear parts, often are coated, or at least partially coated, with chrome plating as a hard, protective layer to extend the usable life of the wear parts. Chrome plating used on wear parts additionally or alternatively may be referred to as hard chrome, industrial chrome, and/or engineered chrome. Chrome plating used on wear parts typically has a thickness in the range of approximately 1-5 mils, which may be referred to as standard chrome plating. Sometimes, chrome plating with a thickness in the range of approximately 0.3-1 mil may be used, and which may be referred to as thin dense chrome plating.

Chrome plating of wear parts generally includes a transition, or taper, between coated sections, regions, or features of the part and uncoated sections, regions, or features. The chrome plating may therefore be described as defining a coating profile that includes a region of uniform thickness plating and one or more regions where the plating tapers away from the region of uniform thickness to zero. These regions of tapered thickness may additionally or alternatively be referred to as run-out regions or run-off regions, and/or the plating may be described as having run-out or run-off. These regions of tapered thicknesses may be desired, so as to limit stress enhancement regions, to limit edge based wear, and to generally increase the fatigue life of the part.

Due to the tolerances, and sometimes critical tolerances, associated with mechanical assemblies that include wear parts, it is often desirable for replacement wear parts to have a coating profile that matches, as close as possible, if not exactly, the coating profile of the part being replaced. Differences in thicknesses of coatings and run-outs between a replacement part and a part being replaced of less than 0.5, or even less than 0.1, mils may be significant in some applications.

SUMMARY

Wear parts having run-out and methods of producing the same are disclosed. Systems and control structures used to produce wear parts having run-out also are disclosed. Some wear parts according to the present disclosure include coatings that have a desired or predetermined coating profile. Some wear parts according to the present disclosure are replacement parts for parts that have a desired or predetermined coating profile. Some wear parts according to the present disclosure include a coating that is applied with a deposition process. Methods according to the present disclosure include depositing a coating on a wear part surface so that the coating has a desired or predetermined coating profile. Also disclosed are methods of designing custom masking jigs for use with a deposition process to produce wear parts having a desired or predetermined coating profile.

BRIEF DESCRIPTION OF THE DRAWINGS

FIG. 3 is a schematic profile view representing illustrative, non-exclusive examples of control structures and wear parts according to the present disclosure, together with schematic representation of electric fields created during a plasma-enhanced chemical vapor deposition process associated with the control structures and wear parts.

DESCRIPTION

Figure 1:
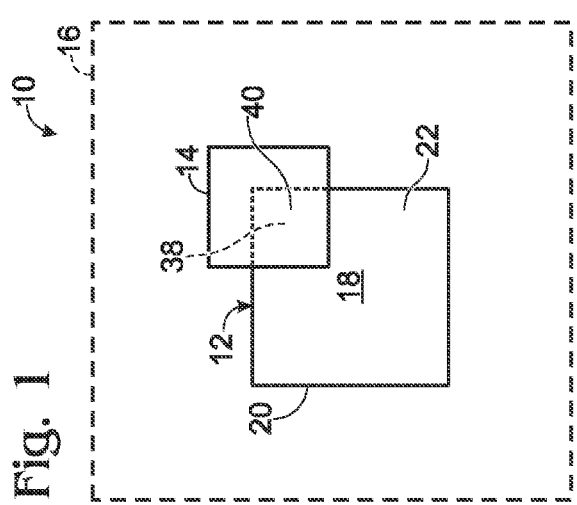
FIG. 1 is a diagram schematically illustrating systems, including wear parts, control structures, and deposition machines, according to the present disclosure.

Methods of producing wear parts having a desired or predetermined coating profile and associated systems, control structures, wear parts, software and other methods are disclosed herein. FIG. 1 schematically illustrates a system 10 associated with methods according to the present disclosure. As schematically illustrated, a system 10 may include one or more of a wear part 12, a control structure 14, and a deposition machine 16.

Wear parts 12 according to the present disclosure include any suitable wear parts, for which a specific coating profile is desired or predetermined. For example, wear parts 12 may include (but are not limited to) one or more of fasteners, bushings, bearing carriers, sleeves, and/or pins. Wear parts 12 utilized in the aerospace industry, for example, may include parts associated with landing gear systems, flap and actuator systems, or any other systems that include parts that typically require replacement over time. However, wear parts 12 according to the present disclosure are not limited to wear parts utilized in the aerospace industry, and wear parts 12 may be utilized within assemblies associated with such illustrative, non-exclusive examples as aircraft, automobiles, spacecraft, trains, machine tools, robots, manufacturing machines, drilling equipment, pumping equipment, energy generation equipment, vibration absorption equipment, and any other suitable mechanical assembly.

Figure 2:
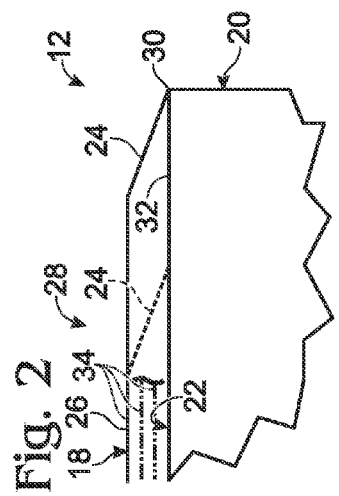
FIG. 2 is a schematic profile view representing illustrative, non-exclusive examples of wear parts according to the present disclosure.

Wear parts 12 may include a coating or plating 18 that is applied utilizing a deposition process. In some embodiments (although not required), the coating or plating 18 may be a protective layer on the wear part 12. A wear part 12 may be described in terms of before and after a coating 18 is applied. Moreover, with reference to FIG. 2, a wear part may be described in terms of having a body 20 that includes at least one surface 22, on which the coating 18 is applied, adhered, or otherwise bonded to. Although not required, some wear parts 12 may include a multi-layered coating, such as schematically illustrated in FIG. 2 in dash-dot-dot lines. The schematic representation in FIG. 2 illustrates three optional layers 34 of coating 18; however, one, two, three, or four or more layers may be deposited as a coating 18 on a wear part 12. As illustrative, non-exclusive examples, materials that may be used for one or more layers of a coating 18 include materials selected for adhesion properties, for stress control properties, for durability properties, and/or for ductility properties. Some coatings may be described as multi-layered films for enhancing ductility and/or durability properties. Other types of coatings and optional layers of coatings also are within the scope of the present disclosure.

Illustrative, non-exclusive examples of materials from which a wear part body 20 may be constructed include (but are not limited to) steel, high-strength steel, stainless steel, aluminum, aluminum alloy, titanium, titanium alloy, nickel, nickel alloy, molybdenum, and molybdenum alloy, as well as non-metallic materials, such as thermoplastics. Illustrative, non-exclusive examples of materials of coating 18 include (but are not limited to) nitride based wear coating materials and diamond-like carbon. In addition to nitride based wear coating materials and diamond-like carbon, any materials that may be deposited onto body 20 utilizing a deposition process may be used for a coating 18. Illustrative, non-exclusive examples of suitable deposition processes include (but are not limited to) chemical vapor deposition (CVD) processes, such as (but not limited to) plasma-enhanced chemical vapor deposition (PECVD). Illustrative, non-exclusive examples of materials that may be deposited as a coating 18 include (but are not limited to) silicon dioxide (from dichlorosilane, silane, tetraethoxysilane, cyclic organosilanes), silicon nitrides (silane+ammonia or nitrogen), silicon oxy-nitrides, silicon carbide, carbon nanotubes & buckminster fullerenes, silicon-germanium, molybdenum, tantalum, titanium, nickel, tungsten, indium phosphide, trimethylaluminium (TMA or TMAl), triethylaluminium (TEA or TEAl), trimethylgallium (TMG or TMGa), triethylgallium (TEG or TEGa), trimethylindium (TMI or TMIn), triethylindium (TEI or TEIn), di-isopropylmethylindium (DIPMeIn), ethyldimethylindium (EDMIn), isobutylgermane (IBGe), dimethylamino germanium trichloride (DiMAGeC), tetramethylgermane (TMGe), tetraethylgermane (TEGe), phenyl hydrazine, dimethylhydrazine (DMHy), tertiarybutylamine (TBAm), ammonia NH3, phosphine PH3, tertiarybutyl phosphine (TBP), bis-phosphinoethane (BPE), arsine AsH3, tertiarybutyl arsine (TBAs), monoethyl arsine (MEAs), trimethyl arsine (TMAs), trimethyl antimony (TMSb), triethyl antimony (TESb), tri-isopropyl antimony (TIPSb), stibine SbH3, dimethyl cadmium (DMCd), diethyl cadmium (DECd), methyl allyl cadmium (MACd), dimethyl telluride (DMTe), diethyl telluride (DETe), di-isopropyl telluride (DIPTe), dimethyl selenide (DMSe), diethyl selenide (DESe), di-isopropyl selenide (DIPSe), zinc, dimethylzinc, diethylzinc (DEZ), AlGaAs, AlGaInP, AlGaN, AlGaP, GaAsP, GaAs, GaN, GaP, InAlAs, InAlP, InSb, InGaN, GaInAlAs, GaInAlN, GaInAsN, GaInAsP, GaInAs, GaInP, InN, InP, InAs, zinc selenide (ZnSe), HgCdTe, ZnO, zinc sulfide (ZnS), Si, Ge, strained silicon, and GeSbTe.

As seen with reference to FIG. 2, coating 18 may include a transition region 24, in which the thickness of the coating is different and in some embodiments varies from a region of generally uniform thickness 26. In some examples, the transition region 24 may taper, slope, or diminish away from the region of generally uniform thickness 26. In some examples, the transition region 24 may taper from the thickness of the region of generally uniform thickness 26 to zero. The region of generally uniform thickness 26 additionally or alternatively in some embodiments may be described as a region of maximum thickness of coating 18. Transition region 24 additionally or alternatively may be referred to as run-out, run-off, a run-out region, a run-off region, and/or as a region of reduced thickness, for example, in embodiments in which the transition region tapers away from the region of generally uniform thickness 26. Collectively, the transition region 24 and the region of generally uniform thickness 26 may be described as defining a coating profile 28 of the wear part 12, or alternatively of the coating 18, for example, with the coating profile 28 representing specific thicknesses, contours, slopes, and/or positions of region 24 and region 26 relative to each other and relative to body 20 of the wear part. Transition region 24 may be important in some applications, so as to reduce the fatigue properties and stress concentrations associated with a portion of a wear part 12.

In some embodiments, although not required, the transition region 24 of coating 18 may be adjacent to an edge 30 of the body 20 of a wear part 12. Additionally or alternatively, in some embodiments, the transition region 24 may be described as being positioned on, or within, an edge region 32 of the body 20 of a wear part 12. In solid lines in FIG. 2, transition region 24 is schematically illustrated as spanning the entirety of an edge region 32 from the region of generally uniform thickness 26 to an edge 30 of the wear part's body 20. However, as schematically illustrated in dashed lines in FIG. 2, a transition region 24 may terminate at a point that is spaced away from an edge 30 of the wear part's body 20. In such embodiments, the transition region 24 still may be described as being adjacent to the edge 30, for example, because it is adjacent to the edge 30 relative to the region of generally uniform thickness 26. Other configurations are within the scope of the present disclosure, including embodiments of wear parts 12 in which a transition region 24 is not adjacent to an edge 30 of a wear part body relative to a region of generally uniform thickness 26.

Illustrative, non-exclusive examples of thicknesses associated with a region of generally uniform thickness 26 include thicknesses in the range of about 0.3-5 mils, including thicknesses in the range of about 0.3-1 mils and in the range of about 0.8-3 mils, and including thicknesses greater than 0.3, 0.5, 0.75, 1, 1.5, 2, 2.5, 3, 3.5, 4, 4.5, or 5 mils. Thicknesses less than, greater than, and within the various enumerated values herein are within the scope of the present disclosure.

Prior to the inventive subject matter of the present disclosure, PECVD processes were used to deposit coatings with thicknesses less than 0.3 mil. Because coatings of such thinness typically do not create stress concentrations associated with the edges of the coatings, defining a predetermined run-out profile associated with coatings less than 0.3 mil generally has not been needed.

In examples of coatings that optionally include more than one layer, such as of different materials, the aspect ratio of the layers within the transition region 24 may be maintained, although such a limitation is not required to all embodiments. As discussed herein, a deposition process may facilitate the maintaining of the aspect ratios associated with optional multi-layer coatings.

In some applications of wear parts according to the present disclosure, a wear part 12 may be a replacement part, with the wear part 12 having a configuration corresponding to a desired or predetermined coating profile 28 that is associated with a part being replaced. In other words, a wear part 12 according to the present disclosure may be a replacement part that is specifically designed, configured, manufactured, produced, and/or coated to have a coating profile 28 that corresponds to, is identical to, and/or is nearly identical to a coating profile of the part being replaced. In some examples, the coating of the wear part 12 may be of a different material than the coating of a part being replaced.

Examples of a part that may be replaced by a wear part include parts that have a coating, or plating, with a specific coating, or plating, profile. For examples, chrome plating including hard chrome, industrial chrome, and/or engineering chrome plating having thicknesses corresponding to standard chrome plating (1-5 mil thickness) or thin dense chrome plating (0.3-1 mil thickness) may correspond to a part being replaced. Additional illustrative, non-exclusive examples of coatings associated with a part being replaced include (but are not limited to) coatings that have a potential for environmental impact, such as coatings that include material on an Environmental Protection Agency (EPA) watch list (e.g., nickel). Other examples of parts that may be replaced by a wear part 12 are within the scope of the present disclosure, including parts that do not have a plating or coating and parts that have a plating or coating that include a material other than the materials identified herein.

Control structures 14 according to the present disclosure include any suitable structure that may be utilized to create a desired or predetermined coating profile 28 of a wear part 12. In FIG. 1, control structure 14 is schematically illustrated as being positioned relative to wear part 12, with such representation schematically representing any suitable relative positioning between a wear part 12 and a control structure 14 during a process for applying a coating 18. For example, although schematically illustrated as overlapping only a portion of a perimeter of the schematically represented wear part 12, a control structure 14 may be positioned in any suitable position, depending on the configuration of the control structure 14, depending on the configuration of the wear part 12, depending on the configuration of a desired or predetermined coating profile associated with a wear part 12, and/or depending on the process used to apply a coating 18. As schematically indicated in FIG. 1, the relative position between the control structure 14 and a wear part 12 may define a region 40, for example, with such region being defined by, or defining, a volume of space between the control structure and the wear part. Region 40 additionally or alternatively may define a region associated with deposition of a transition region 24 of a coating 18.

As discussed herein, a coating 18 may be applied to a wear part 12 utilizing a deposition process, such as utilizing a deposition machine 16. As an illustrative, non-exclusive example, such a deposition machine may be chemical vapor deposition (CVD) machine, such as (but not limited to) a plasma-enhanced chemical vapor deposition (PECVD) machine, including an ion-assisted PECVD machine. PECVD is a process that deposits material from a gaseous, plasma state to a solid state on a substrate, by imparting an electric potential between the substrate and an inside surface of the deposition chamber, with the substrate and the inside surface of the deposition chamber serving as electrodes. Accordingly, ions and/or radicals of the material being deposited bombard the substrate and are thus deposited thereon.

To create a desired or predetermined coating profile 28 of a wear part 12 utilizing a deposition process, the electric field induced during the deposition process may be controlled, or manipulated, adjacent to the surface 22 on which a coating 18 is desired. Such control, or manipulation, may be accomplished by a control structure 14. Accordingly, a control structure 14 may be described as being specifically configured to be positioned relative to a wear part 12, or to the body 20 of a wear part 12, or to a wear part surface 22, to define a region of reduced electric field 38 adjacent to a portion of the wear part on which a less thickness of deposited material is desired.

FIG. 3 schematically represents illustrative, non-exclusive examples of control structure 14 in the form of a masking jig 42. Masking jig 42 additionally or alternatively may be referred to as a fixture 42 or as a masking fixture 42. As indicated in FIG. 3, the masking jig is positioned relative to a wear part 12 to define a volume 44 between the masking jig 42 and the surface 22 of the wear part 12 to be coated with a coating 18. In some embodiments, masking jig 42 may be described as including an overhang 46 that is configured to extend over the edge region 32 of the wear part's body 20, with the position of the overhang 46 defining the volume 44 between the overhang 46 and the edge region 32.

As schematically indicated with the electric field lines 50 in FIG. 3, during a PECVD or other suitable deposition process, the electric field that is induced, is diminished, or reduced, within the volume 44. As schematically illustrated, the amount of reduction of the electric field increases with the depth into the volume 44. This reduction in the electric field is schematically represented in FIG. 3 with the spacing of the electric field lines 55 increasing with the depth into the volume 44 beneath the overhang 46. Accordingly, region 40 may be described as a region of reduced electric field 38 within the volume 44 defined between the masking jig and the wear part surface 22. This reduced electric field results in less material being deposited on the wear part surface within the region of the reduced electric field 38, and specifically with less material the deeper into the volume that material is deposited, thus resulting in run-out.

The reduction in the electric field in region 40 is a result of a decreased potential gradient. Specifically, in the context of a PECVD process, the potential drops near the surface of the substrate (e.g., wear part 12), which serves as a cathode. When a structure of equal potential is placed in close proximity to the substrate surface, such as with the case of a masking jig 42 adjacent to the edge region 32 of a wear part 12, the two equal potential surfaces (i.e., the surface 22 and the overhang surface 48) limit the potential gradient that can form. Since the electric field gradient is directly proportional to the potential gradient, the electric field also decreases. In a PECVD system, the deposition rate is dependent on the local field, because the radicals used to coat the substrate are ions, which accelerate toward the surface due to the electric field. Accordingly, the deposition rate is decreased when the electric field is decreased, resulting in less deposition on the substrate in the region of reduced electric field 38.

Masking jigs 42 therefore may be configured, or otherwise customized or specifically designed, to result in a desired or predetermined coating profile 28 associated with a wear part 12. One or more of the size, shape, material of the masking jig, and/or the positioning of the masking jig 42 relative to the wear part surface 22 may be selected to manipulate, or control, the coating profile 28 produced during a deposition process. Additionally or alternatively, the shape of the volume 44 between the masking jig 42 and the wear part surface 22 may be preselected to define a desired or predetermined coating profile 28.

When a multi-layered coating is desired, the same masking jig 42 may be used to deposit each layer of the coating without removal or cleaning of the masking jig 42. As discussed, such a process may result in an aspect ratio of the layers being maintained between the transition region 24 and the region of generally uniform thickness 26.

In some embodiments, overhang 46 may define an overhang surface 48 that has a contour that corresponds to the edge region 32 of the wear part surface 22. In some embodiments, the overhang surface 48 may be generally parallel to the wear part surface 22 when the overhang 46 is positioned in a spaced-apart position relative to the wear part surface 22 for use during deposition of a coating 18. Other configurations also are within the scope of the present disclosure, with two illustrative, non-exclusive examples of overhang surfaces 48 schematically illustrated in FIG. 3 in dash-dot and dash-dot-dot lines and having slopes relative to the wear part surface 22.

In some embodiments, the appropriate positioning of the masking jig 42 relative to the wear part surface 22 for a desired or predetermined coating profile 28 may result in a gap 52 in the range of 10-500, 10-200, 10-100, 10-50, 50-500, 50-200, 50-100, 100-500, 100-200, or 200-500 mils between the overhang 46 and the wear part surface 22. Any suitable gap, including gaps that are less than, greater than, and within the enumerated values, are within the scope of the present disclosure and may be used to produce a desired or predetermined coating profile 28.

The length of overhang 46 may be selected together with the gap 52 to define a desired or predetermined coating profile 28. Illustrative, non-exclusive examples of suitable lengths of overhangs 46 include (but are not limited to) lengths in the range of 10-1000, 10-800, 10-600, 10-400, 10-200, 200-1000, 200-800, 200-600, 200-400, 400-1000, 400-800, 400-600, 600-1000, 600-800, and 800-1000 mils, as well as lengths greater than 10, 200, 400, 600, 800, or 1000 mils. Lengths less than, greater than, and within the various enumerated values are within the scope of the present disclosure and may be used to produce a desired or predetermined coating profile 28.

In FIG. 3, masking jig 42 is schematically illustrated as being engaged with wear part 12, but such a configuration is not required in all methods according to the present disclosure, and in some configurations, the masking jig 42 may not engage the wear part 12 being coated during a deposition process.

Masking jigs 42 may be constructed of any suitable material, such that use of a masking jig results in a desired or predetermined coating profile. For example, a masking jig may be constructed at least partially, and in some embodiments at least predominantly or completely, of a conductive material. In some embodiments, at least a portion of an outer surface of the masking jig, such as (but not limited to) corresponding to at least the overhang surface 48, may be constructed of, or include, a conductive material. In some circumstances, it may be desirable for the masking jig to be constructed of the same material as the body of the wear part being coated. In some embodiments, the masking jig may serve as an electrode during the deposition process. In some embodiments, the masking jig 42 and the wear part 12 may have an equal potential during the deposition process. In some such examples, during a deposition process, the material of the coating 18 also may be deposited on the masking jig 42, as schematically and optionally indicated at 54 in FIG. 3.

Figure 4:
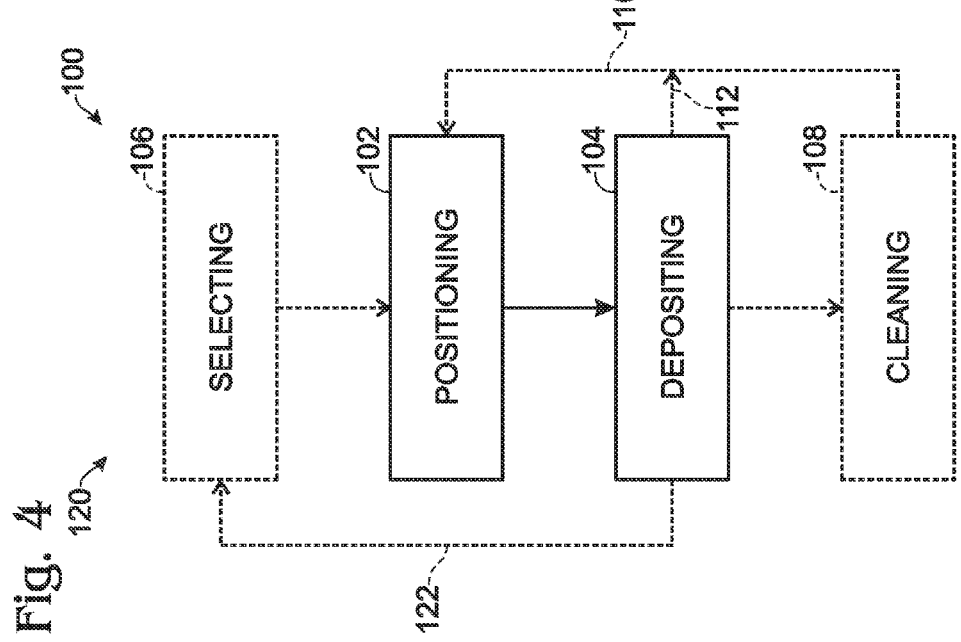
FIG. 4 is a flow-chart schematically representing illustrative, non-exclusive methods according to the present disclosure.

FIG. 4 schematically provides a flowchart that represents illustrative, non-exclusive examples of methods according to the present disclosure. In FIG. 4, some steps are illustrated in dashed boxes indicating that such steps may be optional or may correspond to an optional version of a method according to the present disclosure. That said, not all methods according to the present disclosure are required to include the steps illustrated in solid boxes. The methods and steps illustrated in FIG. 4 are not limiting and other methods and steps are within the scope of the present disclosure, including methods having greater than or fewer than the number of steps illustrated, as understood from the discussions herein.

FIG. 4 schematically illustrates a method 100 of coating a wear part surface 22 according to a desired or predetermined coating profile 28. Methods 100 according to the present disclosure include the positioning of a control structure 14 relative to a wear part 12, as indicated at 102, and then after the positioning, include the depositing of a material on the wear part surface 22 of the wear part 12, as indicated at 104.

In some methods 100, such as that utilize a control structure 14 in the form of a masking jig 42, the positioning 102 may include positioning the masking jig 42 relative to the wear part 12 to define a volume 44 between the masking jig 42 and the wear part surface 22. In some such methods, the depositing 104 may include depositing the coating material utilizing a deposition process, such as (but not required to be) a chemical vapor deposition (CVD) process, including a plasma-enhanced chemical vapor deposition (PECVD) process, in which the position of the masking jig 42 relative to the wear part surface defines the region of reduced electric field 38 so that a transition region 24 is deposited on the portion of the wear part surface 22 that bounds volume 44. Some methods 100 may include utilizing ion-assisted PECVD.

Some methods 100 additionally or alternatively may include a step of selecting an appropriate control structure or masking jig 42, as indicated at 106, to define a desired or predetermined coating profile 28 on a wear part 12.

In some methods 100, such as that utilize a masking jig 42 that is constructed at least partially of a conductive material, such that the masking jig 42 serves as an electrode together with the wear part 12 during the deposition process, the masking jig 42 may need to be cleaned of deposited material, as indicated at 108. Such a step may be required because the material being deposited on the wear part surface 22 also will be deposited on the masking jig 42, and if the masking jig 42 is to be used again, the deposited material may need to be removed, so that method 100 may be repeated, as schematically indicated at 110. Additionally or alternatively, a used masking jig 42 may be disposed of, or otherwise not used again.

Additionally or alternatively, a masking jig 42 may be used more than once without cleaning, as schematically indicated in FIG. 4 at 112.

Illustrative, non-exclusive examples of cleaning processes 108 include (but are not limited to) abrasive processes, such as sand-blasting, chemical processes, etching processes, laser ablation, and dissolution processes.

Also within the scope of the present disclosure and schematically illustrated in FIG. 4 are methods 120 of designing a control structure 14, including a masking jig 42. For example, as indicated at 122, after the depositing step 104, in which a coating 18 is applied to a wear part 12, a new masking jig may be selected that is different from the first masking jig that was used. Additionally or alternatively, the first masking jig may be altered. In such methods, the new or altered masking jig may be selected based at least in part on observing the coating profile 28 produced with the first masking jig and comparing the coating profile 28 to a desired coating profile. As a result of such observation, the new or altered masking jig may define a volume 44 between the second masking jig and the second wear part surface that is different than the volume 44 that was defined between the first masking jig and the first wear part surface.

As an example, methods 120 may be performed to design a desired masking jig for manufacturing replacement wear parts that have a coating profile that corresponds to a coating profile 28 of the part being replaced by the replacement parts.

Additionally or alternatively, a method of designing a custom masking jig for creating a desired coating profile on a wear part may include modeling, with a computer, one or more steps of a method according to the present disclosure, including a method 100 or a method 120. Moreover, software, such as embodied by computer-executable instructions, may direct a computer to perform one or more steps of a method according to the present disclosure, and is within the scope of the present disclosure.

EXAMPLE

This example describes an illustrative, non-exclusive example of a utilization of a method according to the present disclosure to deposit a coating on a substrate with the resultant coating having a run-out.

Figure 5:
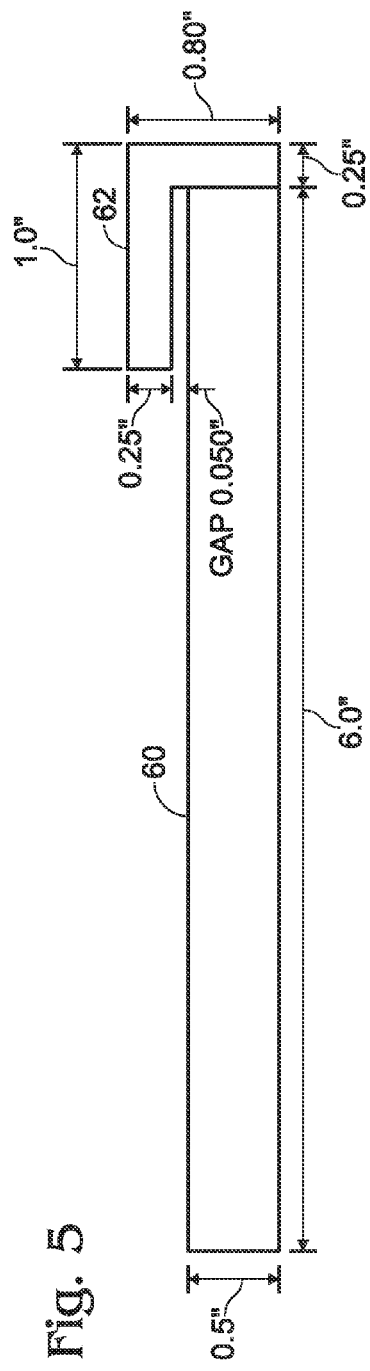
FIG. 5 is a schematic representation of a cross-sectional profile of a substrate together with an illustrative, non-exclusive example of a masking jig according to the present disclosure.

FIG. 5 shows a schematic representation of a cross-sectional profile of a substrate 60, which may correspond to a wear part 12 according to the present disclosure, together with an illustrative, non-exclusive example of a masking jig 62 that was constructed for purposes of the test. The dimensions of the substrate 60 and the masking jig 62 are indicated in FIG. 5 in inches. Both the substrate 60 and the masking jig 62 were constructed of titanium. The substrate 60 and masking jig 62 were placed in the chamber of a plasma-enhanced chemical vapor deposition (PECVD) machine, and a coating of diamond-like carbon with a thickness of approximately 1 mil was applied.

Figure 6:
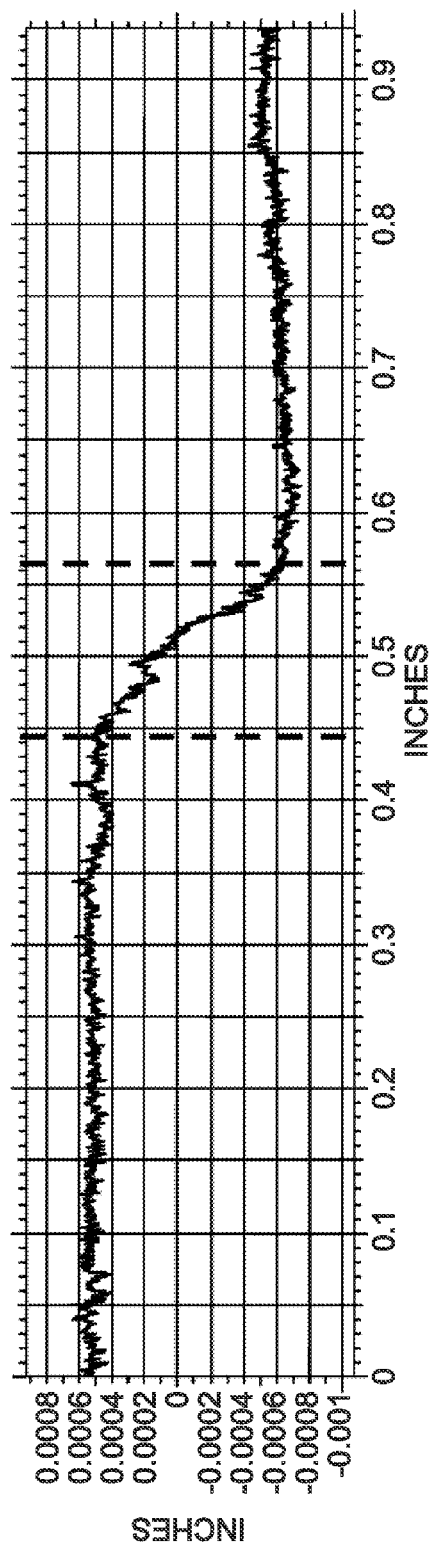
FIG. 6 is a chart that graphically represents profilometry data acquired in connection with the deposition of diamond-like carbon on the substrate of FIG. 5 utilizing an illustrative, non-exclusive example of a method according to the present disclosure.

Following the deposition of the diamond-like carbon, profilometry data was acquired for the coated substrate 60, effectively detecting the surface characteristics of the applied coating. FIG. 6 graphically represents the profilometry data and therefore graphically represents the resultant coating profile of the applied coating. As seen in the region between the two vertically orientated dashed lines, the resultant coating profile includes a region of run-out, which tapers approximately 1 mil in thickness over a width of approximately 0.1 inches.

Illustrative, non-exclusive examples of inventive subject matter according to the present disclosure are described in the following enumerated paragraphs:

A. A method of coating a wear part surface, the method comprising:
positioning a masking jig relative to a wear part, wherein the wear part includes a wear part surface to be coated, and wherein the positioning generally defines a volume between the masking jig and the wear part surface; and
after the positioning, depositing a deposited material to the wear part surface utilizing chemical vapor deposition (and optionally plasma-enhanced chemical vapor deposition), in which the position of the masking jig relative to the wear part surface defines a region of reduced electric field within the volume between the masking jig and the wear part surface, wherein the deposited material defines a coating profile, and optionally wherein the depositing includes depositing less thickness of the deposited material on a portion of the wear part surface that bounds the volume between the masking jig and the wear part surface than on a portion of the wear part surface that does not bound the volume between the masking jig and the wear part surface.

A1. The method of paragraph A, wherein the coating profile is a predetermined (or desired) coating profile.

A1.1. The method of paragraph A1, wherein the predetermined coating profile corresponds to a part to be replaced by the wear part.

A1.1.1. The method of paragraph A1.1, wherein the wear part includes a bushing, a bearing carrier, a pin, a fastener, a sleeve, landing gear hardware, flap hardware, or actuator hardware.

A1.1.2. The method of any of paragraphs A1.1-A1.1.1, wherein the wear part to be replaced includes or included chrome and/or a material having an adverse environmental impact.

A1.2. The method of any of paragraphs A1-A1.1.2, wherein the predetermined coating profile includes a tapered region that is adjacent to an edge of the wear part surface.

A2. The method of any of paragraphs A-A1.1.2,
wherein the masking jig includes an overhang; and
wherein the positioning includes:
positioning the overhang in a spaced-apart position relative to the wear part surface to be coated to define the volume between the masking jig and the wear part surface.

A2.1. The method of paragraph A2, wherein the overhang defines an overhang surface that has a contour corresponding to an edge region of the wear part surface.

A2.1.1. The method of paragraph A2.1.1, wherein the overhang surface is generally parallel to the wear part surface when the overhang is positioned in the spaced-apart position.

A3. The method of any of paragraphs A-A2.1.1, wherein a shape of the volume between the masking jig and the wear part surface is preselected to define a predetermined coating profile on the wear part surface.

A4. The method of any of paragraphs A-A3, wherein the positioning results in a gap of approximately 10-500, 10-200, 10-100, 10-50, 50-500, 50-200, 50-100, 100-500, 100-200, or 200-500 mils between the overhang and the wear part surface.

A5. The method of any of paragraphs A-A4, wherein the masking jig is constructed at least partially of a conductive material, and optionally wherein at least a portion of an outer surface of the masking jig includes the conductive material.

A5.1. The method of paragraph A5 (when depending from paragraph A2), wherein the overhang is constructed at least partially of the conductive material.

A6. The method of any of paragraphs A-A5.1, wherein the masking jig and the wear part are constructed at least partially of the same material.

A7. The method of any of paragraphs A-A6, wherein the masking jig serves as an electrode during the depositing.

A8. The method of any of paragraphs A-A7, wherein during the depositing the wear part and the masking jig have an equal potential.

A9. The method of any of paragraphs A-A8, further comprising: after the depositing, removing the deposited material from the masking jig.

A9.1. The method of paragraph A9, wherein the removing includes an abrasive process, sand-blasting, a chemical process, an etching process, laser ablation process, or a dissolution process.

A10 The method of any of paragraphs A-A9.1, further comprising: repeating the depositing to deposit a second layer of material.

A11 The method of any of paragraphs A-A10, wherein the depositing includes depositing a multi-layered coating.

A12. The method of any of paragraphs A-A11, further comprising: repeating the positioning and the depositing with a second wear part.

A13. The method of any of paragraphs A-A12, wherein the masking jig is a first masking jig and the wear part is a first wear part, the method further comprising:

after the depositing, altering the first masking jig to define a second masking jig or selecting a second masking jig that is configured differently than the first masking jig; and repeating the positioning and the depositing with a second wear part and the second masking jig, wherein the second wear part has the same configuration of the first wear part, and wherein a volume between the second masking jig and the second wear part surface is different than the volume between the first masking jig and the first wear part surface.

A13.1. The method of paragraph A13, wherein the altering or selecting is based at least in part on observing the coating profile of the first wear part after the depositing and then comparing the coating profile to a desired coating profile.

A13.2. The method of any of paragraphs A13-A13.1, wherein the method is performed to design a desired masking jig for manufacturing replacement parts having coating profiles corresponding to parts being replaced and/or to the desired coating profile (when depending from paragraph A13.1).

A13.3. A masking jig produced as a result of the method of any of paragraphs A13-A13.2.

A14. The method of any of paragraphs A-A13.3, wherein the masking jig is a custom masking jig configured specifically for use with the wear part.

A15. The method of any of paragraphs A-A14, wherein the depositing results in a thickness of the deposited material on the portion of the wear part surface that does not bound the volume between the masking jig and the wear part surface that is greater than 0.3, 0.5, 0.75, 1, 1.5, 2, 2.5, 3, 3.5, 4, 4.5, or 5 mils.

A16. The method of any of paragraphs A-A14, wherein the depositing results in a thickness of the deposited material on the portion of the wear part surface that does not bound the volume between the masking jig and the wear part surface that is between about 0.3 and 1 mils, between about 0.3 and 5 mils, or between about 1 and 5 mils.

A17. The method of any of paragraphs A-A16, wherein the wear part is a replacement part for a part having a configuration corresponding to the wear part after the depositing.

A17.1. The method of paragraph A17, wherein the deposited material is different than a coating material of a part being replaced.

A17.2. The method of any of paragraphs A17-A17.1, wherein a coating material of a part being replaced includes chrome and/or a material having an adverse environmental impact.

A18. The method of any of paragraphs A-A17.2, wherein the deposited material includes nitride based wear coating material.

A19. The method of any of paragraphs A-A18, wherein the deposited material includes diamond-like carbon.

A20. The method of any of paragraphs A-A19, wherein the wear part is constructed of steel, high-strength steel, stainless steel, aluminum, titanium, nickel, molybdenum, or thermoplastic.

A21. A method of designing a custom masking jig for creating a desired coating profile on a wear part utilizing a plasma-enhanced chemical vapor deposition process, the method comprising:

modeling, with a computer, the method of any of paragraphs A-A20.

A21.1. Computer readable storage media including computer-executable instructions that, when executed, direct a computer to perform the method of paragraph A21.

A22. A coated wear part produced utilizing the method of any of paragraphs A-A20.

A23 A mechanical assembly including the wear part of paragraph A22, wherein the mechanical assembly optionally is an aircraft, an automobile, a spacecraft, a train, a machine tool, a robot, a manufacturing machine, drilling equipment, energy generation equipment, or vibration absorption equipment.

B. A method of coating a wear part surface, comprising:
depositing a deposited material to the wear part surface utilizing plasma-enhanced chemical vapor deposition; and
controlling the depositing to define a desired coating profile on the wear part surface, wherein the desired coating profile includes a region of substantially uniform thickness of the deposited material and one or more regions of tapered thicknesses of the deposited material adjacent to one or more edges of the wear part surface.

B1. The method of paragraph B, further comprising subject matter of any of paragraphs A-A22.

C. A method of coating a wear part surface, comprising:
depositing a deposited material to the wear part surface utilizing plasma-enhanced chemical vapor deposition, during which an electric field is induced adjacent to the wear part surface; and
controlling the electric field to produce a desired coating profile associated with the wear part.

C1. The method of paragraph C, further comprising the subject matter of any of paragraphs A-B1.

D. A control structure for use with a deposition process, and optionally a chemical vapor deposition process, and further optionally a plasma-enhanced chemical vapor deposition process, for coating a wear part surface of a wear part with a predetermined coating profile, wherein the control structure is specifically configured to be positioned relative to the wear part to define a region of reduced electric field adjacent to a portion of the wear part on which less thickness of deposited material is desired during the deposition process.

D1. The control structure of paragraph D, comprising a masking jig, wherein the masking jig includes an overhang specifically configured to be positioned relative to the wear part to define a volume between the overhang and the wear part surface, wherein the volume is specifically shaped to induce the region of reduced electric field within the volume during the deposition process.

D2. The control structure of any of paragraphs D-D1, wherein the wear part includes a bushing, a bearing carrier, a pin, a fastener, a sleeve, landing gear hardware, flap hardware, or actuator hardware.

D3. The control structure of any of paragraphs D-D2 in combination with the wear part.

D4. The control structure of any of paragraphs D-D3 in combination with a deposition machine, and optionally a chemical vapor deposition machine, and further optionally a plasma-enhanced chemical vapor deposition machine.

E. A wear part, comprising:
a body having a surface; and
a coating on the surface, wherein the coating defines a coating profile, and wherein the coating was applied using a deposition process, and optionally a chemical vapor deposition process, and further optionally a plasma-enhanced chemical vapor deposition process.

E1. The wear part of paragraph E, wherein the coating has a region of maximum thickness and a region of reduced thickness.

E1.1. The wear part of paragraph E1, wherein the region of reduced thickness is adjacent an edge of the surface.

E1.2. The wear part of any of paragraphs E1-E1.1, wherein the region of reduced thickness is sloped relative to the region of maximum thickness.

E1.3. The wear part of any of paragraphs E1-E1.2, wherein the region of reduced thickness slopes away from the region of maximum thickness.

E1.4. The wear part of any of paragraphs E1-E1.3, wherein the maximum thickness is greater than 0.3, 0.5, 0.75, 1, 1.5, 2, 2.5, 3, 3.5, 4, 4.5, or 5 mils.

E1.5. The wear part of any of paragraphs E1-E1.3, wherein the maximum thickness is between about 0.3 and 1 mils, between about 0.3 and 5 mils, or between about 1 and 5 mils.

E2. The wear part of any of paragraphs E-E1.5, wherein the wear part includes a bushing, a bearing carrier, a pin, a fastener, a sleeve, landing gear hardware, flap hardware, or actuator hardware.

E3. The wear part of any of paragraphs E-E2, wherein the coating includes a nitride based wear coating material or diamond-like carbon.

E4. The wear part of any of paragraphs E-E3, wherein the body is constructed of steel, high-strength steel, stainless steel, aluminum, titanium, nickel, molybdenum, or thermoplastic.

The various disclosed elements of systems and apparatuses disclosed herein and the various disclosed steps of methods disclosed herein are not required to all systems, apparatuses, and methods according to the present disclosure. Moreover, one or more of the various elements and steps disclosed herein may define independent inventive subject matter that is separate and apart from the whole of a disclosed system, apparatus, or method. Accordingly, such inventive subject matter is not required to be associated with the specific systems, apparatuses, and methods that are expressly disclosed herein, and such inventive subject matter may find utility in systems, apparatuses, and/or methods that are not expressly disclosed herein.

As used herein the terms "adapted" and "configured" mean that the element, component, or other subject matter is designed and/or intended to perform a given function. Thus, the use of the terms "adapted" and "configured" should not be construed to mean that a given element, component, or other subject matter is simply "capable of" performing a given function but that the element, component, and/or other subject matter is specifically selected, created, implemented, utilized, programmed, and/or designed for the purpose of performing the function. It is also within the scope of the present disclosure that elements, components, and/or other recited subject matter that is recited as being adapted to perform a particular function may additionally or alternatively be described as being configured to perform that function, and vice versa.

While the invention has been disclosed in its preferred form or method, the specific alternatives, embodiments, and/or methods thereof as disclosed and illustrated herein are not to be considered in a limiting sense, as numerous variations are possible. The present disclosure includes all novel and non-obvious combinations and subcombinations of the various elements, features, functions, properties, methods, and/or steps disclosed herein. Similarly, where any disclosure above or claim below recites "a" or "a first" element, step of a method, or the equivalent thereof, such disclosure or claim should be understood to include incorporation of one or more such elements or steps, neither requiring nor excluding two or more such elements or steps.

It is believed that the following claims particularly point out certain combinations and subcombinations that are directed to one of the disclosed inventions and are novel and non-obvious. Inventions embodied in other combinations and subcombinations of features, functions, elements, properties, methods, and/or steps may be claimed through amendment of the present claims or presentation of new claims in this or a related application. Such amended or new claims, whether they are directed to a different invention or directed to the same invention, whether different, broader, narrower, or equal in scope to the original claims, also are regarded as within the subject matter of the invention of the present disclosure.

The invention claimed is:

1. A method of coating a wear part surface, the method comprising:

positioning a masking jig relative to a wear part within a chamber of a chemical vapor deposition machine, wherein the wear part includes a wear part surface to be coated, wherein the positioning defines a volume between the masking jig and the wear part surface, wherein the masking jig includes an overhang, wherein the positioning includes positioning the overhang in a spaced-apart position relative to the wear part surface to be coated to define the volume between the masking jig and the wear part surface, and wherein the positioning results in the masking jig not extending across an entirety of the wear part and the masking jig not engaging the wear part surface; and after the positioning, depositing a material to the wear part surface resulting in a deposited material, wherein the depositing utilizes chemical vapor deposition including inducing an electric field in the chamber, wherein the position of the masking jig relative to the wear part surface defines a region of reduced electric field within the volume between the masking jig and the wear part surface during the inducing, and wherein the deposited material defines a coating profile in which a thickness of the deposited material is not uniform across the wear part surface as a result of the masking jig being positioned relative to the wear part;

wherein the wear part is constructed of at least one of steel, high-strength steel, stainless steel, aluminum, aluminum alloy, titanium, titanium alloy, nickel, nickel alloy, molybdenum, and molybdenum alloy;

wherein the masking jig is constructed of a conductive material; and wherein during the depositing, the wear part and the masking jig both serve as an electrode and have an equal potential.

2. The method of claim 1, wherein the coating profile is a predetermined coating profile.

3. The method of claim 2, wherein the wear part is a replacement part for a part, and wherein the predetermined coating profile corresponds to a profile of the part.

4. The method of claim 3, wherein the wear part includes a bushing, a bearing carrier, a pin, a fastener, a sleeve, landing gear hardware, or flap hardware.

5. The method of claim 3, wherein the wear part to be replaced includes a chrome plating.

6. The method of claim 2, wherein the predetermined coating profile includes a tapered region that is adjacent to an edge of the wear part surface.

7. The method of claim 1, wherein the overhang defines an overhang surface that has a contour corresponding to an edge region of the wear part surface.

8. The method of claim 7, wherein the overhang surface is generally parallel to the wear part surface when the overhang is positioned in the spaced-apart position.

9. The method of claim 1, wherein a shape of the volume between the masking jig and the wear part surface is preselected to define a predetermined coating profile on the wear part surface.

10. The method of claim 1, wherein the masking jig is a custom masking jig configured specifically for use with the wear part.

11. The method of claim 1, wherein the depositing results in a thickness of the deposited material that is between about 0.3 and 5 mils.

12. The method of claim 1, wherein the wear part is a replacement part for a part, wherein the wear part, after the depositing, has a profile that corresponds to a profile of the part, and wherein the deposited material is different than a coating material of the part.

13. The method of claim 1, wherein the depositing includes depositing a multi-layered coating.

14. The method of claim 1, wherein the deposited material includes at least one of nitride based wear coating material and diamond-like carbon.

15. A computer-implemented method of designing a custom masking jig for creating a desired coating profile on a wear part utilizing a plasma-enhanced chemical vapor deposition process, the method comprising:

modeling, with a computer, chemical vapor deposition of a deposited material on the wear part, in which a masking jig is positioned adjacent to the wear part in a chamber of a chemical vapor deposition machine, in which the wear part includes a wear part surface to be coated, in which the masking jig includes an overhang in a spaced-apart position relative to the wear part surface, in which the overhang does not extend across an entirety of the wear part surface, in which the masking jig does not engage the wear part surface, in which the chemical vapor deposition includes inducing an electric field in the chamber, in which a region of reduced electric field is defined between the overhang and the wear part surface, in which the chemical vapor deposition results in the deposited material defining a coating profile as a result of the masking jig being positioned adjacent to the wear part, in which the wear part is constructed of at least one of steel, high-strength steel, stainless steel, aluminum, aluminum alloy, titanium, titanium alloy, nickel, nickel alloy, molybdenum, and molybdenum alloy, in which the masking jig is constructed of a conductive material, and in which the wear part and the masking jig both serve as an electrode and have an equal potential.

16. A coated wear part produced utilizing the method of claim 1.

17. A method, comprising:
performing the method of claim 1; and
after the performing, replacing a part with the wear part.

18. The method of claim 1, wherein the positioning results in a gap between the overhang and the wear part surface in the range of 100-500 mils.

19. The method of claim 1, wherein the masking jig is constructed of the same material as the wear part.

* * * * *